United States Patent
Vogt

(10) Patent No.: US 7,047,624 B2
(45) Date of Patent: May 23, 2006

(54) METHOD FOR PRODUCING A TAG OR A CHIP CARD HAVING A COIL ANTENNA

(75) Inventor: Werner Vogt, Remetschwil (CH)

(73) Assignee: Interlock AG (CH)

( * ) Notice: Subject to any disclaimer, the term of this patent is extended or adjusted under 35 U.S.C. 154(b) by 31 days.

(21) Appl. No.: 10/240,509

(22) PCT Filed: Mar. 31, 2001

(86) PCT No.: PCT/IB01/00532

§ 371 (c)(1),
(2), (4) Date: Sep. 30, 2002

(87) PCT Pub. No.: WO01/73800

PCT Pub. Date: Oct. 4, 2001

(65) Prior Publication Data

US 2003/0112202 A1 Jun. 19, 2003

(30) Foreign Application Priority Data

Mar. 31, 2000 (DE) .................... 100 16 037

(51) Int. Cl.
*H01P 11/00* (2006.01)
(52) U.S. Cl. ............... 29/600; 29/601; 29/593; 343/700 MS; 343/846
(58) Field of Classification Search ............ 29/600, 29/601, 602.1, 25.42, 841, 846, 847; 343/895, 343/702, 700; 340/572, 825.54, 825.3; 235/491, 235/492; 336/200; 174/250, 261; 342/51
See application file for complete search history.

(56) References Cited

U.S. PATENT DOCUMENTS

| 2,622,054 | A | * | 12/1952 | Franklin ..................... 156/251 |
| 4,970,495 | A | * | 11/1990 | Matsumoto et al. ..... 340/572.1 |
| 5,754,110 | A | * | 5/1998 | Appalucci et al. ....... 340/572.5 |
| 5,781,110 | A | * | 7/1998 | Habeger et al. ......... 340/572.5 |
| 5,829,121 | A | * | 11/1998 | Shoemaker et al. .......... 29/600 |
| 5,946,198 | A | | 8/1999 | Hoppe et al. |
| 6,176,010 | B1 | * | 1/2001 | Droz ........................... 29/832 |
| 6,195,858 | B1 | * | 3/2001 | Ferguson et al. .......... 29/25.42 |

FOREIGN PATENT DOCUMENTS

| DE | 38 36 480 | 11/1989 |
| DE | 197 13 642 | 10/1998 |
| EP | 682 321 | 11/1995 |
| GB | 22 11 702 | 7/1989 |
| WO | WO 98/56019 | 12/1998 |
| WO | WO 00/349016 | 6/2000 |

* cited by examiner

*Primary Examiner*—Minh Trinh
(74) *Attorney, Agent, or Firm*—Klaus P. Stoffel

(57) ABSTRACT

A method for manufacturing a tag encompassing an antenna or coil that is capable of at least one of wirelessly transmitting information to remote receivers and receiving information from remote transmitters. The method includes die-cutting a coil or antenna shape from an electrically conductive flat double foil having an upper electrically conductive flat foil layer of a soft, inelastic metal and a lower synthetic film substrate layer, the die-cutting including cutting with a die-cutting tool having a single die-cutting blade which matches the desired antenna or coil shape, the blade completely perforating the upper electrically conductive flat foil and at least partially separating the lower synthetic film substrate so that a gap the distance created in the flat foil by die-cutting remains after the die-cutting tool is removed. Subsequently the cut shape is bonded with additional layers including an electronic chip module.

3 Claims, 2 Drawing Sheets

METHOD FOR PRODUCING A TAG OR A CHIP CARD HAVING A COIL ANTENNA

PRIORITY CLAIM

This is a U.S. national stage of application No. PCT/IB01/00532, filed on Mar. 31, 2001. Priority is claimed on that application and on the following application: Country: Germany, Application No.: 100 16 037.9, Filed: Mar. 31, 2000.

BACKGROUND OF THE INVENTION

The present invention concerns a method for manufacturing a tag which encompasses an antenna or a coil. The invention further relates to an apparatus for executing the method i, and a tag encompassing an antenna or coil or a corresponding chip card.

Chip cards or identification cards encompassing an antenna or a coil or similar small-scale assemblies such as for instance tags, transponder units and the like, are known in a multiplicity of embodiments. They generally serve to receive wireless information and, in some cases, to process it, but also to transmit information, for instance concerning the location, the properties of the objects connected to it and similar information (back) to the appropriate receivers.

In addition to many other areas of application, the use of so-called tags is becoming increasingly important, for instance for baggage sorting at airports, where hundreds of thousands of suitcases are conveyed to their correct destinations using automated transportation systems, as well as for postal items, where they make automated sorting possible. To achieve this, specific address codes are entered into the tags and the tags are then attached to the particular goods, with the tags wirelessly conveying relevant information to any inquiry units along the automated transportation route, so that for instance, switching units or distribution belts or sorting devices along the transportation route can respond.

In order to receive or transmit such information wirelessly, such tags, as they shall be known representatively for all other assemblies containing antennas or coils, chip or identification cards, transponders or the like, all require coiled, wound or meandering lengths of wire in some helical form for receiving or transmitting electromagnetic signals, which are usually in a digitally encoded form.

However, when attaching or applying such coils or antennas to each substrate, there are certain problems that significantly increase the cost of such tags that are now required in their millions. This means that the commonly used etching technique, with which single coil connections can be applied to chip-card foil substrates (EP 0 481 776 A2), requires numerous additional processing steps. In particular, these involve the application of photoresist to vapour-deposited or otherwise applied conductive layers, then their exposure using masks and the removal of intermediate layers by means of etching, all of which make the production of such tags considerably more expensive, especially when one considers the large number of units common in this field.

Turns of the coil are also known that are basically wire windings attached in the form of a continuous winding on a synthetic substrate with the aid of complex wiring and cutting machines, whereby the synthetic substrate is heated thermally at the same time in such a way that the turns of the wire bond at least partially with the heated synthetic substrate material and in this way retain their shape at least until further layers can be applied (U.S. Pat. No. 3,674,602, international PCT application WO 95/26538).

Both methods of attaching the wire are complicated as well as time-consuming, with WO 95/26538 also proposing that the coil wire be connected to the first terminal pad of a chip located on the chip card at the same time as it is being laid. Then the coil wire is laid to create the coil and finally the running end of the coil wire is connected to a second terminal pad on the chip, whereby the wire is connected at least partially to the substrate during the laying of the coil wire as a consequence of the substrate being heated.

SUMMARY OF THE INVENTION

It is thus the aim of this present invention to propose a method with a device for producing a tag that encompasses an antenna or a coil or some other arrangement that not only drastically simplifies but substantially minimises the costs involved in producing and arranging the coil on the tag or chip card in this way.

A particular advantage offered by the present invention results from the fact that only one single additional production step is required for the preparation of the coil or antenna during the automated production of such tags or chip cards, namely a die-cutting process.

This die-cutting process allows the antenna to be produced in any shape, also ones which match the shape of the tag; this means that in the preferred and therefore also the simplest embodiment, no post-processing steps are required.

The entire process of manufacturing the coil or antenna occurs during the in-line automated tag production operation without any special additional steps and consists solely in a conductive foil being added, commonly a copper or aluminium foil applied to the supporting substrate, and a die-cutting tool cutting the desired antenna shape (spiral, rectangular, meandering or any other shape) into the copper-coated foil in a cutting process. Additional processing operations are not required as a result of the specific properties of the copper or aluminium foil which allow a functional antenna configuration to be immediately created on a supporting substrate. After this stage, the chip is connected in the customary manner and then preferably, the finished tag is achieved by means of additional layers being applied in a bilateral lamination process.

If the preferred embodiment of the present invention is employed, no die-cut parts have to be removed during the die-cutting process in order to produce the antenna, a process which would necessitate employing an additional operation involving a gripping action—a single die-cutting process is sufficient, for instance in a spiral shape, in order to immediately produce a spiral wound antenna on the copper-coated substrate, the two ends of which only need to be attached to the respective chip module, for instance by crimping or soldering if desired.

In actual fact, one of the main features of the invention is based on the realisation that by employing a special original material, namely a substrate with a conductive coating and preferably consisting of a synthetic material, such as for instance a copper-coated polyester film, the adjacent turns of the copper spiral formed during the die-cutting process can be electrically isolated effectively so that no further additional processing steps are necessary. The reason for this shall be explained in more detail below.

It must be pointed out once again that the invention is suitable for producing or for installing into any transponder-type systems, units, tags, chip or identification cards, access cards or keys, credit cards and the like, whereby the following text refers only to tags, being representative of all such systems; in the same manner the term antenna is used to designate any configurations of coil structures or other coils with turns wound around each other in the form of a winding.

Not only does the invention make it possible to manufacture such tags, which are now required in great numbers, considerably faster in comparison with, for instance, the step-by-step wire application method involving intermediate attachments in accordance with both the publications cited at the outset, but also substantially reduces the number of processing stages required in comparison with the known etching method. In this way and in conjunction with the structural simplification, it represents an effective reduction in costs.

Modifications and refinements to the invention constitute the subject matter of the sub-claims or can be found in the following description.

BRIEF DESCRIPTION OF THE DRAWINGS

Embodiments of the invention are shown in the drawing and shall be presented in more detail in the description below.

DETAILED DESCRIPTION OF THE PREFERRED EMBODIMENTS

The basic idea behind the present invention is to create an extended sequence of antenna or coil windings or turns by die-cutting these from a flat layer of electrically conductive material, whereby said windings or turns can be employed in the manufacture of tags or generally in the manufacture of transponder-type assemblies.

The preferred embodiment of the invention shall be described directly below in greater detail, whereby the basic material for the manufacture of the antenna is a flat foil of electrically conductive material, commonly copper or aluminium foil, which is applied or laminated onto a supporting substrate, preferably a synthetic film such as polyester.

The thickness of such a polyester film can for instance range between 50 and 250 μ, but can be set at any thickness as required, in the same manner as the thickness of the copper foil used for the actual manufacturing process is of subordinate significance and can be derived from the other parameters (such as the transmitting power) of such a tag.

Figure 1:
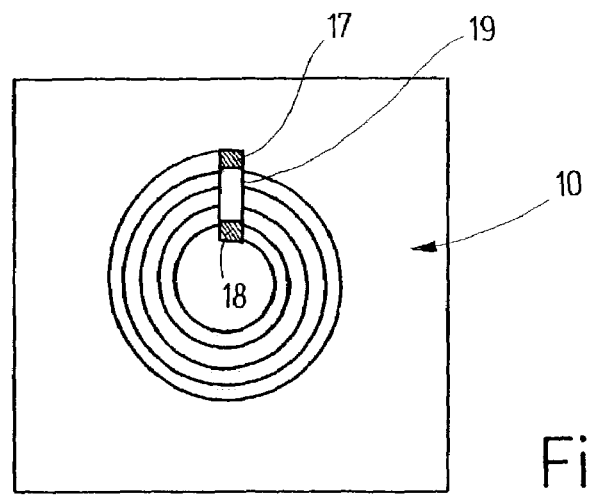
FIG. 1 shows a schematic top view of a first embodiment of a copper or aluminium coated substrate foil for the manufacture of antennas.

In FIG. 1 the double-layered original material in the form of a double foil is indicated by the number 10; it consists (FIG. 2) of an (upper) copper foil 11 and the lower, synthetic film substrate 12.

In order to manufacture an antenna or a coil with a large number of turns from such a double foil 10 by means of die-cutting, a cutting tool is required that has a correspondingly shaped blade.

Figure 2:
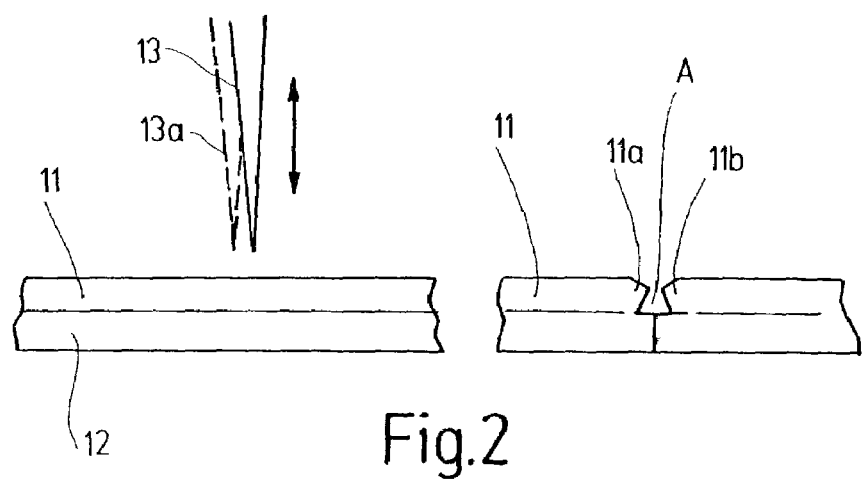
FIG. 2 shows a schematic and greatly magnified lateral view of a copper or aluminium foil applied to a synthetic substrate film before and after the die-cutting procedure by means of a die-cutting tool shown in schematic form.

This blade can have a cross-section that is shaped as shown in FIG. 2 by object 13; it can either taper to a point or be of equal thickness across the entire width of the double foil 10 comprising the two layers 11 and 12, a fact which is of little significance to the die-cutting process. One can imagine a suitable die-cutting tool with reference to the so-called steel-strip tools known from printing technology, with which any number of shapes can be produced by means of die-cutting paper, namely a form of die-cutting from a larger sheet of paper or cardboard.

Figure 3:
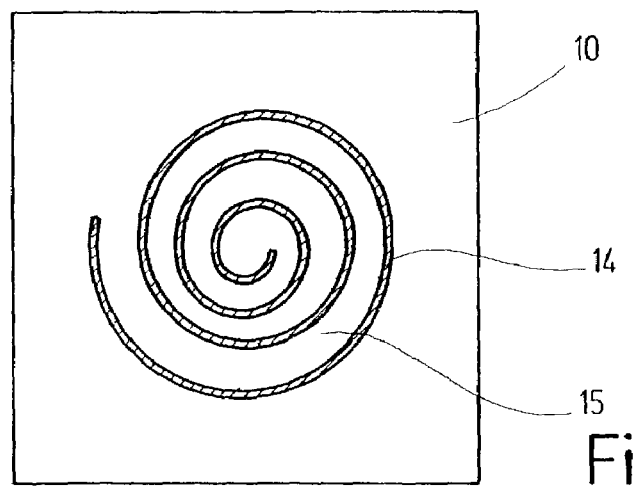
FIG. 3 shows a second embodiment of a spiral-shaped die-cut incision in the flat foil of a conductive material, with or without additional substrate.

If one applies such a steel-strip tool die-cutting process to the possibilities for manufacturing antennas or coils for transponder-like arrangements, the longitudinal shape of the lower blade of the die-cutting tool, that is the section used to die-cut the shapes into the double foil 10, would follow the desired shape of the coil or antenna to be manufactured, whereby with respect to the embodiment shown in FIG. 1 and also in FIG. 3, a spiral-shaped, i.e. an inwardly tapered coil winding has been selected.

Of course, the antenna's windings and turns can be shaped completely differently—for instance, the individual turns of the antenna can follow the outer, possibly rectangular shape of the double foil and cut out specific sections as other assemblies are to be located on the tag or the chip card for instance (e.g. other electronic components, chip card push buttons or the like)—the structure of the die-cutting tool is always such that the entire winding, in this case a spiral, inwardly tapered winding, is cut into the double foil in a single die-cutting process.

A further possibility which exists within this context consists of designing a die-cutting tool which has dual blades in the die-cutting zone, consisting of two lower cutting edges displaced minimally from each other as suggested by 13a in FIG. 2. If the entire die-cutting tool has a spiral shape, a narrow spiral strip 14 is die-cut from the double foil 10' (FIG. 3), which is then removed during the course of the processing operation, i.e. it must be removed, leaving a copper or aluminium strip 15 (subject to the selected material) with turns that are isolated from each other and which is spiral or volute in shape.

However, the preferred embodiment of the present invention involves working with only one single die-cutting edge 13 and dispensing with such a direct die-cutting process, an approach which has proven to be quite successful, also with respect to the required isolating displacement of the individual turns of the coil or antenna produced. The reason for this can be found in the fact that the copper or aluminium foil on the synthetic substrate 12 proves to be relatively soft in terms of its material response and not at all elastic. Following the die-cutting process, that is after the double foil 10 has been incised or perforated, a phenomenon occurs whereby the perforated copper foil edges remain separated from each other, while the perforated edges of the synthetic substrate 12 approach each other again due to the elastic or yielding behaviour of this substrate. This results in a shape such as that shown schematically in the greatly magnified cross-sectional representation on the right hand side of FIG. 2 following the die-cutting procedure and after the die-cutting tool 13 has been retracted. The descending die-cutting tool initially cuts the copper foil, inevitably pressing it slightly apart in order to be able to physically incise and perforate the double foil 10 at all. At the same time the edges 11a, 11b of the copper foil are pressed down slightly, that is they are slightly deformed, a factor that contributes appreciably to the creation of the separation A between both edges of the copper foil. Of course, the synthetic substrate 12 is also perforated—although in this case other solutions are conceivable—but the synthetic film exhibits a different response in terms of its material properties, causing its edges or at least those in the zone facing away from the copper foil to approach each other again, that is yield toward each other, while the distance A between the edges of the copper foil remains the same after the die-cutting process.

At the same time, this die-cutting process alone results in the creation of a sufficiently isolating separation A between the individual (spiral) turns of the antenna, with the antenna shape preferably being fixed in a processing stage that follows the previous one immediately and which involves the strip comprising the double foil 10 travelling further through the processing machine and having an adhesive film applied from below, that is onto the synthetic film substrate. It makes sense to leave the (copper) surface of the antenna or coil created in this way uncovered in order to be able to connect a chip 19 in subsequent processing stages.

It can be observed that the separation achieved between the individual turns of the antenna by means of the die-cutting process is a function of a multiplicity of variables, not the least being the shape of the die-cutting tool, the thickness and yield characteristics of the synthetic substrate employed, the thickness and non-elastic behaviour of its copper or aluminium coating, and the fact as to whether the synthetic substrate is fully perforated or only incised to a certain depth with the simultaneous pressing apart of the copper foil edges cut as a result of the die-cutting process. In the latter case, the advantage is that the turns, which are relatively mobile in relation to each other when the substrate is fully perforated, but which are also fixed immediately by means of subsequent bonding, always retain their shape and their level of separation from each other, making the adhesive fixing step superfluous.

Figure 4:
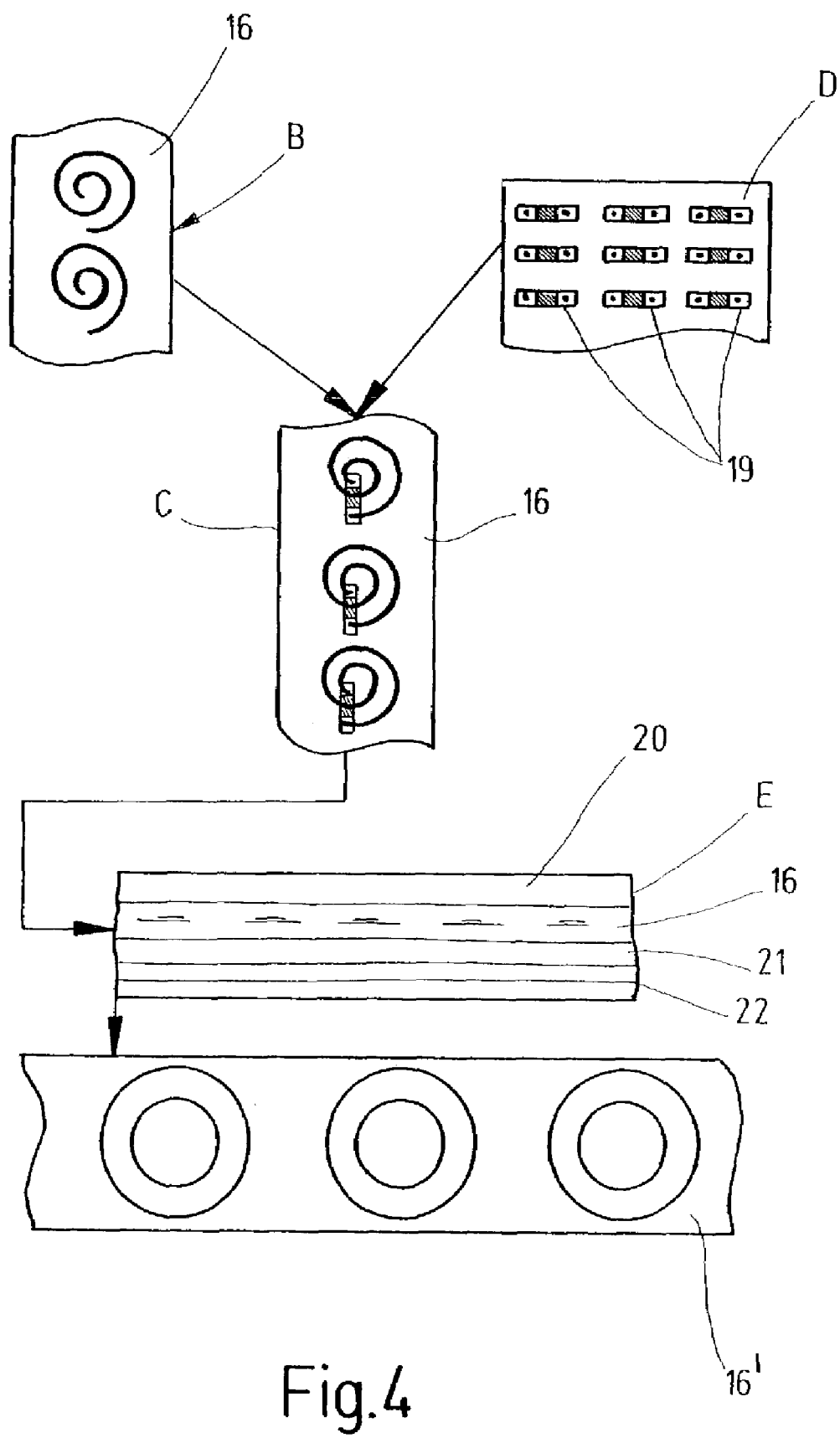
FIG. 4 schematically shows a possible automated production chain for tags.

The entire manufacturing process, which is intended for instance to be employed to produce tags and which is substantially simplified by the invention, thus proceeds as suggested schematically in FIG. 4; an appropriately designed automated in-line facility stamps the antenna shapes from the continuously fed strip 16 at point B as described above; at point C the individual antennas on the strip 16 are finished by adding individual chip modules being fed from point D, whereby as suggested in FIG. 1, the beginning 17 and end 18 of the stamped antenna shape are connected to the corresponding terminal pads of the chip module 19, preferably by means of crimping, but possibly also by means of soldering or other bonding techniques. The strip 16 with the antennas finished by the addition of the chip module 19 is then conveyed to the laminating unit E, where processing is completed by the addition of additional upper and lower layers 20, 21, 22 by means of adhesive or heating. The final laminated strip 16' with individual tags positioned along it can then be dispatched to the user in this form or the tags are separated from the strip by means of an additional cutting or die-cutting process.

What is claimed is:

1. A method for manufacturing a tag encompassing a coil or antenna shape capable of at least one of wirelessly transmitting information to remote receivers and receiving information from remote transmitters, comprising steps of: die-cutting the coil or antenna shape from an electrically conductive flat double foil having an upper electrically conductive flat foil layer of a soft, inelastic metal and a lower synthetic film substrate layer, the die-cutting including cutting with a die-cutting tool which matches a desired antenna or coil shape, the tool completely perforating the upper electrically conductive flat foil and at least partially separating the lower synthetic film substrate so that an open gap distance is only created in the flat foil layer by die-cutting and remains after the die-cutting tool is removed; and subsequently bonding the cut shape with additional layers including an electronic chip module, wherein the die-cutting tool having narrowly-separated, adjacent twin blades, for the die-cutting step including stamping out a strip of material to be removed from the double foil matching the form of the desired coil or antenna shape.

2. The method in accordance with claim 1, further including initially arranging the electrically conductive flat foil on the synthetic film substrate to form the double foil prior to the die-cutting step.

3. The method in accordance with claim 1, further including feeding the double foil formed as a long strip into an automated processing plant for die-cutting the antenna or coil shapes and subsequently connecting beginning and end sections of the antenna shapes to terminal pads of chips and laminating the chips and die-cut shapes with additional surface layers, while the double foil strip is being conveyed forward.

* * * * *